United States Patent
Ishikawa et al.

(10) Patent No.: US 8,666,691 B2
(45) Date of Patent: Mar. 4, 2014

(54) TEST APPARATUS AND TEST METHOD

(75) Inventors: Shinichi Ishikawa, Saitama (JP); Tetsu Katagiri, Saitama (JP); Masaru Goishi, Saitama (JP); Hiroyasu Nakayama, Saitama (JP); Masaru Tsuto, Saitama (JP)

(73) Assignee: Advantest Corporation, Tokyo (JP)

(*) Notice: Subject to any disclaimer, the term of this patent is extended or adjusted under 35 U.S.C. 154(b) by 283 days.

(21) Appl. No.: 13/118,470

(22) Filed: May 30, 2011

(65) Prior Publication Data

US 2011/0288810 A1 Nov. 24, 2011

Related U.S. Application Data

(63) Continuation of application No. PCT/JP2009/002405, filed on May 29, 2009, and a continuation-in-part of application No. 12/329,635, filed on Dec. 8, 2008, now Pat. No. 8,059,547.

(51) Int. Cl.
*G06F 19/00* (2011.01)
*G01R 31/28* (2006.01)

(52) U.S. Cl.
USPC .................................. 702/123; 714/724

(58) Field of Classification Search
USPC ............................................... 702/123
See application file for complete search history.

(56) References Cited

U.S. PATENT DOCUMENTS

| | | | |
|---|---|---|---|
| 6,067,651 A | 5/2000 | Rohrbaugh et al. | |
| 6,490,700 B1 | 12/2002 | Oshima et al. | |
| 7,802,140 B2 * | 9/2010 | Iwamoto | 714/27 |

FOREIGN PATENT DOCUMENTS

| | | | |
|---|---|---|---|
| JP | H4-218843 A | 8/1992 |
| JP | H08-335610 A | 12/1996 |
| JP | H8-335610 A | 12/1996 |
| JP | H09-264933 A | 10/1997 |
| JP | H10-332795 A | 12/1998 |
| JP | H11-344528 A | 12/1999 |
| JP | 2000-40391 A | 2/2000 |
| JP | 2001-67395 A | 3/2001 |
| JP | 2001-74812 A | 3/2001 |
| JP | 2001-134469 A | 5/2001 |
| JP | 2001-211078 A | 8/2001 |
| JP | 2001-312416 A | 11/2001 |
| JP | 2002-50196 A | 2/2002 |
| JP | 2006-003216 A | 1/2006 |

(Continued)

OTHER PUBLICATIONS

Reasons for Rejection (Office action) issued by the Japanese Patent Office on Dec. 14, 2011 for application JP 2010-541954 citing the new foreign reference above.

(Continued)

*Primary Examiner* — Bryan Bui

(57) ABSTRACT

Provided is a test apparatus that tests a device under test, comprising a testing section that stores a program in which commands to be executed branch according to detected branching conditions and that tests the device under test by executing the program; and a log memory that stores test results of the testing section in association with command paths of the program executed to obtain the test results. The testing section sequentially changes a characteristic of a test signal supplied to the device under test, and judges pass/fail of the device under test for each characteristic of the test signal, and the log memory stores a test result of the testing section in association with a command path of the program, for each characteristic of the test signal.

20 Claims, 12 Drawing Sheets

(56) References Cited

FOREIGN PATENT DOCUMENTS

| JP | 2006-10676 | A | 1/2006 |
|----|------------|---|--------|
| JP | 2007-057541 | A | 3/2007 |
| JP | 2007-096903 | A | 4/2007 |
| JP | 2007-250124 | A | 9/2007 |
| TW | I266070 | B | 11/2006 |
| WO | 2007/023556 | A1 | 3/2007 |

OTHER PUBLICATIONS

Preliminary Notice of First Office Action issued by the Taiwan Intellectual Property Office (TIPO) dated Mar. 27, 2013.
International Search Report (ISR) for International application No. PCT/JP2009/002405 mailed on Aug. 25, 2009.
English translation of Written Opinion (IB338) for International application No. PCT/JP2009/002405 mailed on Jul. 14, 2011.
The New ATE: Protocol Aware, by Andrew C. Evans, Broadcom Corporation, Irvine, CA; Paper 20.1 IEEE 2007.
Office Action of Aug. 9, 2011 issued for counterpart Japanese Application 2010-541954 and machine translation thereof.
Preliminary Notice of First Office Action, dated Feb. 23, 2013 issued by the Taiwan Intellectual Property Office.
Preliminary Notice of First Office Action, dated Mar. 12, 2013 issued by the Taiwan Intellectual Property Office.
JPO Decision of rejection for patent application No. 2010-541954 issued Apr. 10, 2012.
JPO Decision of Amendment Dismissal for patent application No. 2010-541954, issued Apr. 10, 2012.
Notification of First Office Action for Patent Application Filing No. 200980149135.1, issued by the State Intellectual Property Office of the P.R. China on Jul. 1, 2013.
Preliminary Notice of First Office Action for Taiwanese Patent Application No. 098141939, issued by the Taiwanese Patent Office on Dec. 11, 2003.
Preliminary Notice of First Office Action for Taiwanese Patent Application No. 098141937, issued by the Taiwanese Patent Office on Dec. 11, 2013.

* cited by examiner

| ADDRESS | VOLTAGE LEVEL (mV) | TIMING (ps) | COMMAND PATH |
|---|---|---|---|
| 0x0000 | 100 | 0 | 0 |
| 0x0010 | 100 | 10 | 0 |
| 0x0020 | 100 | 20 | 0 |
| 0x0030 | 100 | 30 | 0 |
| 0x0040 | 100 | 40 | 0 |
| 0x0050 | 100 | 50 | 0 |
| 0x0060 | 100 | 60 | 0 |
| 0x0070 | 100 | 70 | 0 |
| 0x0080 | 100 | 80 | 1 |
| 0x0090 | 100 | 90 | 1 |
| 0x0100 | 200 | 0 | 0 |
| 0x0110 | 200 | 10 | 0 |
| 0x0120 | 200 | 20 | 0 |
| 0x0130 | 200 | 30 | 0 |
| 0x0140 | 200 | 40 | 0 |
| 0x0150 | 200 | 50 | 1 |
| . | . | . | . |
| . | . | . | . |
| . | . | . | . |
| 0x0950 | 900 | 50 | 3 |
| 0x0960 | 900 | 60 | 3 |
| 0x0970 | 900 | 70 | 3 |
| 0x0980 | 900 | 80 | 3 |
| 0x0990 | 900 | 90 | 3 |

*FIG. 3*

| | | | | | | | | | | | | | | | |
|---|---|---|---|---|---|---|---|---|---|---|---|---|---|---|---|
| 0 | 1 | 1 | 1 | 1 | 1 | 2 | 2 | 2 | 2 | 3 | 3 | 3 | 3 | 3 |
| 0 | 1 | 1 | 1 | 1 | 1 | 2 | 2 | 2 | 2 | 3 | 3 | 3 | 3 | 3 |
| 0 | 1 | 1 | 1 | 1 | 1 | 2 | 2 | 2 | 2 | 3 | 3 | 3 | 3 | 3 |
| 0 | 1 | 1 | 1 | 1 | 1 | 2 | 2 | 2 | 2 | 3 | 3 | 3 | 3 | 3 |
| 0 | 0 | 1 | 1 | 1 | 1 | 2 | 2 | 2 | 2 | 3 | 3 | 3 | 3 | 3 |
| 0 | 0 | 1 | 1 | 1 | 1 | 1 | 2 | 2 | 2 | 2 | 3 | 3 | 3 | 3 |
| 0 | 0 | 1 | 1 | 1 | 1 | 1 | 2 | 2 | 2 | 2 | 3 | 3 | 3 | 3 |
| 0 | 0 | 1 | 1 | 1 | 1 | 1 | 2 | 2 | 2 | 2 | 3 | 3 | 3 | 3 |
| 0 | 0 | 0 | 1 | 1 | 1 | 1 | 2 | 2 | 2 | 2 | 3 | 3 | 3 | 3 |
| 0 | 0 | 0 | 1 | 1 | 1 | 2 | 2 | 2 | 2 | 2 | 2 | 3 | 3 | 3 |
| 0 | 0 | 0 | 1 | 1 | 1 | 1 | 2 | 2 | 2 | 2 | 2 | 3 | 3 | 3 |
| 0 | 0 | 0 | 1 | 1 | 1 | 1 | 2 | 2 | 2 | 2 | 3 | 3 | 3 | 3 |
| 0 | 0 | 0 | 0 | 1 | 1 | 1 | 2 | 2 | 2 | 2 | 2 | 2 | 3 | 3 |
| 0 | 0 | 0 | 0 | 1 | 1 | 1 | 1 | 1 | 2 | 2 | 2 | 2 | 3 | 3 |
| 0 | 0 | 0 | 0 | 0 | 0 | 0 | 0 | 1 | 1 | 2 | 2 | 2 | 2 | 3 |
| 0 | 0 | 0 | 0 | 0 | 0 | 0 | 0 | 0 | 0 | 0 | 2 | 2 | 2 | 2 |
| 0 | 0 | 0 | 0 | 0 | 0 | 0 | 0 | 0 | 0 | 0 | 0 | 0 | 0 | 0 |

VOLTAGE LEVEL (vertical axis), TIMING (horizontal axis)

*FIG. 4*

```
1   MainProcedure
2   {
3   Test_A(BE_ADDR | RX0, {0x1234...} );
4   if (RESULT == 0x01)
5   {
6      Test_B (BE_ADDR | RX0, {0x1234...} );
7      Read (BE_ADDR | RX0, $VAL1);
8      if ($VAL1 == 0x01)
9          Write(BE_ADDR | RX0, ($VAL1 | 0x2) );
10     else
11         Write(BE_ADDR | RX0, ($VAL1 | 0x8) ) ; }
12         Test_C (BE_ADDR | RX0, {0x7654...} );
13  }
14  else
15  Write(BE_ADDR | RX0, ($VAL1 | 0x1) ) ;
16  }
```

FIG. 5

| VOLTAGE LEVEL | | | | | | | | | | | | | | | |
|---|---|---|---|---|---|---|---|---|---|---|---|---|---|---|---|
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 2 | 2 | 2 | 2 | 3 | 3 | 3 | 3 | 3 | 3 | 3 | 3 |
| | 0 | 1 | 1 | 1 | 2 | 2 | 2 | 3 | 3 | 3 | 3 | 3 | 3 | 3 | 3 |
| | 0 | 1 | 1 | 1 | 2 | 2 | 2 | 2 | 3 | 3 | 3 | 3 | 3 | 3 | 3 |
| | 0 | 1 | 1 | 1 | 2 | 2 | 2 | 2 | 2 | 2 | 2 | 2 | 3 | 3 | 3 |
| | 0 | 0 | 1 | 1 | 1 | 1 | 2 | 2 | 2 | 2 | 2 | 2 | 2 | 3 | 3 |
| | 0 | 0 | 1 | 1 | 1 | 1 | 2 | 2 | 2 | 2 | 2 | 2 | 2 | 2 | 2 |
| | 0 | 0 | 0 | 1 | 1 | 1 | 1 | 1 | 1 | 1 | 1 | 1 | 1 | 1 | 1 |
| | 0 | 0 | 0 | 0 | 1 | 1 | 1 | 1 | 1 | 1 | 1 | 1 | 1 | 1 | 1 |
| | 0 | 0 | 0 | 0 | 0 | 0 | 0 | 0 | 0 | 0 | 0 | 0 | 0 | 0 | 0 |

TIMING

*FIG. 8*

TEST APPARATUS AND TEST METHOD

BACKGROUND

1. Technical Field

The present invention relates to a test apparatus and a test method.

2. Related Art

A test apparatus for testing a semiconductor device, for example, judges pass/fail of the device under test by measuring a signal output by the device under test in response to a test signal having a prescribed pattern. One known technique for judging pass/fail of the device under test involves using a Shmoo plot indicating the judgment results, i.e. pass or fail, of the test on a coordinate plane corresponding to the test parameters. Details of Shmoo plots are provided in Japanese Patent Application Publication No. 2006-003216, for example.

The test apparatus judges pass/fail of the device under test based on whether the output signal of the device under test matches an expected value. As a result, the test apparatus can classify a device under test according to the two ranks of pass and fail, but has difficulty classifying a device under test according to three or more ranks.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. According to a first aspect related to the innovations herein, provided is a test apparatus that tests a device under test, comprising a testing section that stores a program in which commands to be executed branch according to detected branching conditions and that tests the device under test by executing the program; and a log memory that stores test results of the testing section in association with command paths of the program executed to obtain the test results.

According to a second aspect related to the innovations herein, provided is a test apparatus in which the testing section sequentially changes a characteristic of a test signal supplied to the device under test, and judges pass/fail of the device under test for each characteristic of the test signal, and the log memory stores a test result of the testing section in association with a command path of the program, for each characteristic of the test signal.

According to a third aspect related to the innovations herein, provided is a test apparatus test apparatus further comprising a display section that displays the test result for each characteristic of the test signal stored in the log memory, using a different appearance for each command path of the program.

According to a fourth aspect related to the innovations herein, test apparatus in which the testing section sequentially changes one or more characteristics of the test signal supplied to the device under test, and judges pass/fail of the device under test for each change in the one or more characteristics of the test signal, and the display section plots each test result corresponding to a change of the one or more characteristics of the test signal using a different appearance for each command path of the program, in a coordinate system whose axes each represent one of the one or more characteristics of the test signal.

According to a fifth aspect related to the innovations herein, provided is a test apparatus in which the testing section includes a measuring section that measures a state of the device under test; and an execution processing section that executes the program, using a measurement result of the measuring section as the branching condition.

According to a sixth aspect related to the innovations herein, provided is a test apparatus further comprising a grade determining section that judges a grade of the device under test based on a command path of the program corresponding to each test result of the testing section.

According to a seventh aspect related to the innovations herein, provided is a test apparatus in which the test apparatus tests a plurality of the devices under test formed on one wafer, and displays the grade or pass/fail of each device under test in association with a position of the device under test on the wafer.

According to an eighth aspect related to the innovations herein, provided is a test apparatus in which the testing section judges pass/fail for each of a plurality of locations in the device under test, and the display section displays the test results using a different appearance for each location in the device under test for which the pass/fail judgment is made.

The summary clause does not necessarily describe all necessary features of the embodiments of the present invention. The present invention may also be a sub-combination of the features described above.

BRIEF DESCRIPTION OF THE DRAWINGS

FIG. 3 shows exemplary data stored in the log memory 108 by the testing section 100.

FIG. 4 shows an exemplary Shmoo plot displaying command path information for each timing and voltage level of the test signal.

FIG. 5 shows an exemplary program for testing the device under test 200.

FIG. 8 shows an exemplary Shmoo plot of a device under test 200 determined to be grade A.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
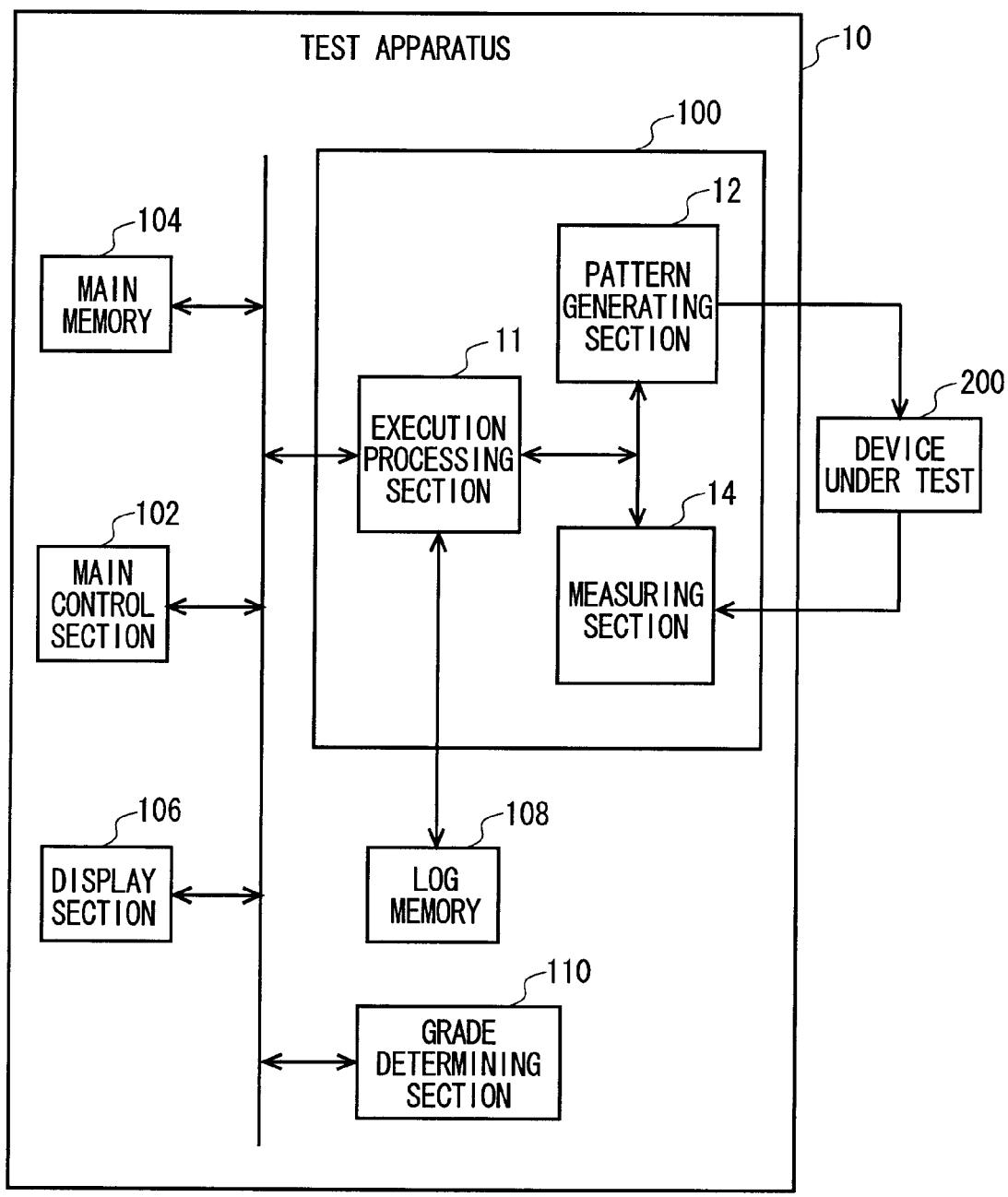
FIG. 1 shows an exemplary configuration of a test apparatus 10 according to an embodiment of the present invention.

FIG. 1 shows an exemplary configuration of a test apparatus 10 according to an embodiment of the present invention. The test apparatus 10 tests a device under test 200 by communicating with the device under test 200. The test apparatus 10 may test the device under test 200 by sending and receiving packets that include prescribed test pattern data to and from the device under test 200. The test apparatus 10 includes a testing section 100, a main control section 102, a main memory 104, a display section 106, a log memory 108, and a grade determining section 110.

The testing section 100 stores a program in which commands to be executed branch according to detected branching conditions, and tests the device under test 200 by executing the program. The program may be a procedure in which is recorded packet sequence information designating the order in which packets are sent to and received from the device under test 200. A packet list, which is information indicating the order of executing different classification functions including control commands for transmitting and receiving the packets, is recorded in the procedure.

More specifically, the testing section 100 may transmit to and receive from the device under test 200 various types of packets including write packets having a function for writing data to the device under test 200, read packets having a function for reading data from the device under test 200, and test packets having a function for inputting test data to the device under test 200. The test apparatus 10 may transmit to the device under test 200 a wait packet that includes information indicating an idle state during which functions are not performed, when not transmitting packets for executing the functions described above. The testing section 100 switches the order of the packets and the type of packets transmitted to and received from the device under test 200 according to a variable value set from the outside or response results from the device under test 200, based on the content recorded in the procedure.

The testing section 100 includes an execution processing section 11, a pattern generating section 12, and a measuring section 14. The execution processing section 11 executes a test program including one or more procedures in series. The pattern generating section 12 is controlled by the execution processing section 11 to transmit packets including data of a prescribed test pattern to the device under test 200. More specifically, the pattern generating section 12 assembles the packets designated by the packet list recorded in the procedure executed by the execution processing section 11 into a prescribed format, and then transmits the packets to the device under test 200.

The measuring section 14 measures a state of the device under test 200. For example, the measuring section 14 receives a response signal transmitted by the device under test 200 in response to a test packet transmitted to the device under test 200. The measuring section 14 judges pass/fail of the device under test 200 by comparing the response signal to a prescribed expected value. The measuring section 14 may input to the execution processing section 11, as the variable value, a data value included in the packet received from the device under test 200.

The execution processing section 11 may execute the program using the measurement results of the measuring section 14 as branching conditions. More specifically, the execution processing section 11 may transmit different types of packets to the device under test 200 via the pattern generating section 12, by using different functions in the procedures according to the comparison results of the measuring section 14 between the response signal and the prescribed expected value. For example, when the measurement result of the measuring section 14 indicates that the response signal does not match the expected value (referred to hereinafter as a "fail judgment"), the execution processing section 11 may retransmit the test packet according to the branching conditions recorded in the procedure. As another example, when the measurement result of the measuring section 14 indicates that the response signal does match the expected value (referred to hereinafter as a "pass judgment"), the execution processing section 11 may retransmit the test packet after transmitting a write packet that includes a variable value for updating the value of the register in the device under test 200.

The execution processing section 11 may execute the program using, as a branching condition, the variable value included in the packet received from the device under test 200 and acquired by the measuring section 14. For example, the execution processing section 11 may retransmit the test packet when the variable value acquired by the measuring section 14 is 0, and may transmit a write packet when the variable value acquired by the measuring section 14 is 1.

The log memory 108 stores the test results of the testing section 100 and the command paths of the program executed to obtain the test results, in association with each other. The command path is information indicating the order of the functions in a procedure executed during testing, for example. The testing section 100 may store information corresponding to the order of the executed functions or the name of the functions executed during testing, for example, in the log memory 108 as the command path, under the control of the execution processing section 11.

The execution processing section 11 may store in the log memory 108 numerical value information allocated to each command path in advance. For example, the execution processing section 11 may store a test result indicating a fail in association with a numerical value of 0 allocated to a command path including retransmission of the test packet, in the log memory 108. As another example, the execution processing section 11 may store, in the log memory 108, a test result indicating a pass in association with a numerical value of 1 allocated to a command path including retransmission of a different type of packet than the test packet after the test result was obtained.

The testing section 100 sequentially changes a characteristic of the test signal provided to the device under test 200, and judges pass/fail of the device under test 200 for each characteristic of the test signal. The testing section 100 may sequentially change the frequency, the transition timing, or the voltage of the test signal, for example. The log memory 108 stores the test result of the testing section 100 in association with the command path of the program, for each characteristic of the test signal. The testing section 100 may store information associating test results in a plurality of different address regions of the log memory 108 with a command path of the program, for each characteristic of the test signal.

The display section 106 displays the test results for each characteristic of the test signal stored in the log memory 108 with a different appearance for each command path of the program. For example, the display section 106 may display a different color or a different pattern according to each command path executed by a procedure, in a coordinate plane in which the horizontal axis represents a first characteristic of the test signal and the vertical axis represents a second characteristic of the test signal. The display section 106 may use different colors to display a case in which a pass judgment is made for the first performance of a test and a case in which a pass judgment is made for a second performance of a test after a fail judgment is made for the first performance. The display section 106 may display each command path of a program differently, in a display format that associates a characteristic of the test signal with the test results for this characteristic.

The testing section 100 may sequentially change one or more characteristics of the test signal provided to the device under test 200, and judge pass/fail of the device under test 200 for each change of the one or more characteristics of the test signal. For example, the testing section 100 may sequentially change the voltage level of the test signal and the timing of the test signal, and judge pass/fail of the device under test 200 by comparing the response signal received from the device under test 200 to a prescribed expected value for each combination of a timing and a voltage level. The timing of the test signal may be the transition phase of the test signal with respect to a reference clock synchronized between the testing section 100 and the device under test 200. The testing section 100 may sequentially change the voltage level and the frequency of the test signal.

The testing section 100 may sequentially switch the timing of the test signal while the voltage level of the test signal is set to a first value, for example. Then, when testing has been performed for all of the preset timings, the testing section 100 switches the voltage level of the test signal to a second value. The testing section 100 sequentially switches the timing of the test signal while the voltage level of the test signal is set to the second value. By performing testing for all of the preset voltage levels in this way, the testing section 100 can judge pass/fail of the device under test 200 for all combinations of the preset timings and voltage levels. As another example, the testing section 100 may sequentially change the voltage level while the timing is set to a prescribed value.

The display section 106 plots the test results corresponding to the changes in the one or more characteristics of the test signal using a different appearance for each command path of the program, in a coordinate system in which each of the one or more characteristics of the test signal is allocated to an axis. For example, the display section 106 may display a two-dimensional coordinate plane in which the timing value of the test signal is allocated to the horizontal axis and the voltage level of the test signal is allocated to the vertical axis. The display section 106 may display a three-dimensional coordinate system in which the timing of the test signal, the voltage level of the test signal, and the frequency of the test signal are respectively allocated to three axes therein. The display section 106 may display a coordinate system having a time axis by sequentially changing only the timing of the test signal.

The display section 106 reads from the log memory 108 the command path of the program in the test applied according to conditions corresponding to each coordinate. For example, when the condition is a combination of a first timing and a first voltage level, the display section 106 may use a first display appearance, i.e. a green color, to display a coordinate corresponding to this combination when the first performance of the test results in a pass judgment. When the condition is a combination of the first timing and a second voltage level, the display section 106 may use a second display appearance, i.e. a yellow color, to display a coordinate corresponding to this condition when the second performance of the test results in a pass judgment after the first judgment has resulted in a fail judgment. When the condition is a combination of the second timing and the second voltage level, the display section 106 may use a third display appearance, i.e. a red color, to display a coordinate corresponding to this condition when the second performance of the test results in a fail judgment.

Figure 2:
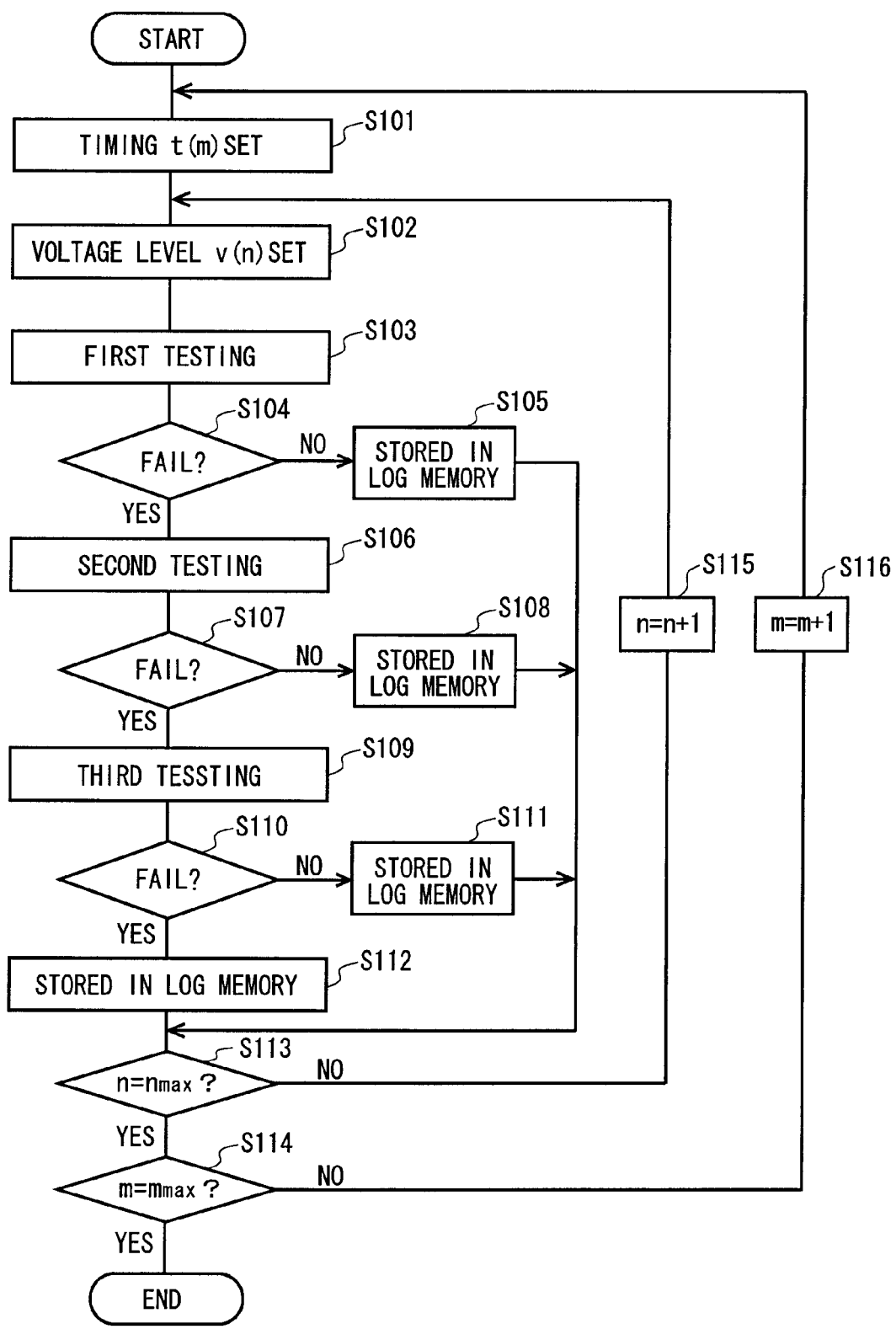
FIG. 2 shows an operational flow performed when the test apparatus 10 tests the device under test 200.

FIG. 2 shows an operational flow performed when the test apparatus 10 tests the device under test 200. The testing section 100 performs this operational flow based on the test program. FIG. 2 shows the timing of the test signal as t(m) and the voltage level of the test signal as v(n), where m and n are integers. The testing section 100 may change the timing of the test signal at prescribed timing intervals, in the order of t(0), t(1), ..., t(m), ..., t($m_{max}$). The testing section 100 may change the voltage level of the test signal at prescribed voltage intervals, in the order of v(0), v(1), ..., v(n), ..., v($n_{max}$).

First, the testing section 100 sets t(0) as the timing of the test signal (S101). The testing section 100 sets v(0) as the voltage level of the test signal (S102). The testing section 100 performs the first testing by transmitting a test packet to the device under test 200. When the judgment result of the measuring section 14 for the response signal received from the device under test 200 indicates a fail (S104), the testing section 100 stores the command path from S101 to S104 in the log memory 108 in association with this test result (S105).

The testing section 100 performs the second testing and the third testing in the same way. The testing section 100 stores each command path in the log memory 108 in association with the corresponding test result. When the third testing is finished (S112), the testing section 100 changes the voltage level of the test signal. More specifically, if the voltage level set at S102 is not the predetermined maximum voltage level v($n_{max}$), the testing section 100 switches to the next voltage level (S115) and performs the testing of S103 to S112.

At S113, when the voltage level set at S102 matches the predetermined maximum voltage level, the testing section 100 changes the timing of the test signal to be t(2) (S116, S101). The testing section 100 sequentially changes the voltage level from v(0) to v($n_{max}$) at this timing, and performs the processes from S102 to S113. When the timing of the test signal matches the maximum value t($m_{max}$) at S114, the testing section 100 ends the testing.

FIG. 3 shows exemplary data stored in the log memory 108 by the testing section 100. The log memory 108 stores information corresponding to the command path of a test result for each combination of timing and voltage level of the test signal. For example, the command path 0 indicates the test result recorded in the log memory 108 at S112 as a result of the command path of from S103 to S110 in FIG. 2. The command path 3 indicates the test results stored in the log memory 108 at S105 as a result of the command path of S103 and S104 in FIG. 2.

In the present embodiment, when the voltage level of the test signal is low and the timing value of the test signal is small with respect to the reference clock, there is a high probability that a fail judgment will result. As a result, for such test conditions, the testing section 100 is more likely to store a value of 0 in the log memory 108 as the information indicating the command path. On the other hand, when the voltage level of the test signal is high and the timing value of the test signal is large, there is a high probability that a pass judgment will result. As a result, for such test conditions, the testing section 100 is more likely to store a value of 3 in the log memory 108 as the information indicating the command path.

FIG. 4 shows an exemplary Shmoo plot displaying command path information for each timing and voltage level of the test signal. In this Shmoo plot, the horizontal axis represents the timing of the test signal and the vertical axis represents the voltage level of the test signal. The number at each coordinate indicates the command path of the test result.

For example, each coordinate displaying a value of 0 indicates that, at the timing and voltage level corresponding to the coordinate, the command path included the steps from S103 to S110 in FIG. 2 and resulted in a fail judgment for the third testing. Each coordinate displaying a value of 1 indicates that, at the timing and voltage level corresponding to the coordinate, the command path included the steps from S103 to S110 in FIG. 2 and resulted in a pass judgment for the third testing. Each coordinate displaying a value of 2 indicates that, at the timing and voltage level corresponding to the coordinate, the command path included the steps from S103 to S107 in FIG. 2 and resulted in a pass judgment for the second testing. Each coordinate displaying a value of 3 indicates that, at the timing and voltage level corresponding to the coordinate, a pass judgment resulted from the first testing The testing section 100 may change the display appearance, e.g. the color or pattern, for each command path. For example, coordinates corresponding to the command path 0 indicating a fail judgment for the third testing may be displayed in red, and coordinates corresponding to the command path 3 indicating a pass judgment for the first testing may be displayed in green. The test apparatus 10 may display a plurality of command paths in the same color. For example, regions corresponding to command paths 1 and 2 may be displayed in the same color.

In this way, the test apparatus 10 of the present embodiment stores the command path of the test program in the log memory 108 in association with each test condition, and then provides a display corresponding to the command path for each coordinate corresponding to the test condition. Accordingly, the test apparatus 10 can generate a Shmoo plot displaying more states than a conventional Shmoo plot that separates the states into either a fail judgment or a pass judgment. Furthermore, the test apparatus 10 can generate the Shmoo plot based on data stored in the log memory 108 after testing is completed. Accordingly, the test apparatus 10 can freely switch the type of command paths displayed in the Shmoo plot according to command path conditions set by a user after testing of the device under test 200 is finished.

The testing section 100 may judge pass/fail for a plurality of locations of the device under test 200, and the display section 106 may display test results with different appearances for each location of the device under test 200 for which the testing section 100 makes a pass/fail judgment. For example, the testing section 100 may judge pass/fail by executing a test program based on different procedures for different pins of the device under test 200. The testing section 100 may generate a Shmoo plot for each pin of the device under test 200, and then display these Shmoo plots in parallel on the same screen using different colors or patterns. The testing section 100 may receive information designating pins of the device under test 200 and switch the type of Shmoo plot being displayed.

Figure 6:
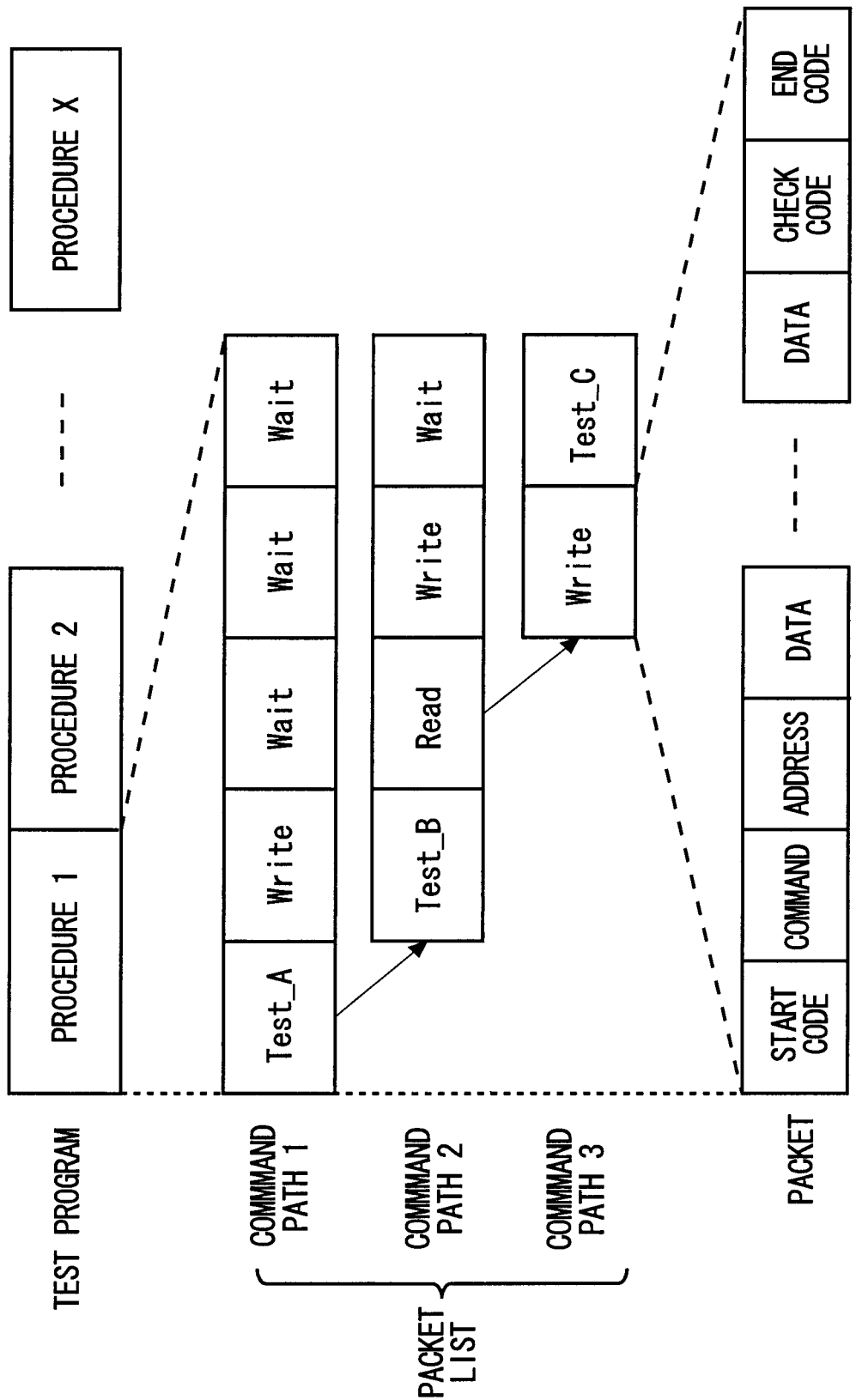
FIG. 6 shows an overview of a packet sequence when the program shown in FIG. 5 is executed.

FIG. 5 shows an exemplary program for testing the device under test 200. FIG. 6 shows an overview of a packet sequence when the program shown in FIG. 5 is executed. The numbers at the left edge of FIG. 5 are line numbers of the program. The testing section 100 transmits a plurality of types of test packets, which in the present example are Test_A, Test_B, and Test_C, according to branching conditions in the program.

More specifically, the execution processing section 11 executes Test_A first, which causes the pattern generating section 12 to transmit to the device under test 200 a test packet that includes the prescribed test pattern 0x1234 . . . (Line 3). The measuring section 14 receives a response signal transmitted by the device under test 200 in response to the test pattern. The measuring section 14 compares the value of the received response signal to an expected value, and notifies the pattern generating section 12 about the comparison result. When the comparison result indicates a pass judgment (Line 4), the execution processing section 11 transmits a write packet (Line 15). The execution processing section 11 stores information indicating the command path corresponding to Line 3-Line 4-Line 15 in the log memory 108, in association with the test result.

When the comparison result indicates a fail judgment (Line 4), the execution processing section 11 executes Test_B (Line 6). The execution processing section 11 transmits a read packet (Line 7) after executing Test_B, and acquires a register value in the device under test 200. The register value may be a value indicating a bit error rate in the device under test 200 or a value indicating whether the bit error rate is less than or equal to a threshold value, for example.

When the register value is 0x01, the execution processing section 11 may judge that retesting is unnecessary because the bit error rate of the device under test 200 is less than the threshold value, and store the command path leading to this judgment in the log memory 108 in association with the test result. When the register value is not 0x01, the execution processing section 11 may judge that retesting is necessary because the bit error rate of the device under test 200 is higher than the threshold value, and transmit a write packet for writing a prescribed value to a register of the device under test 200 (Line 9).

Next, the execution processing section 11 executes Test_C and transmits to the device under test 200 a test packet including the prescribed test pattern 0x7654 . . . (Line 10). The execution processing section 11 acquires the test result of Test_C from the measuring section 14 and stores the command path leading to this acquisition operation in the log memory 108 in association with the test result.

The test apparatus 10 determines the grade of the device under test 200 based on the test results of the device under test 200. More specifically, the grade determining section 110 determines the grade of the device under test 200 based on each command path of the program corresponding to a test result from the testing section 100. The grade determining section 110 may determine the grade of the device under test 200 by comparing a grade determination reference value, which is predetermined for each characteristic of the test signal, to the command path of the program corresponding to the test result of the corresponding characteristic.

For example, for a test at a prescribed timing and voltage level, the grade determining section 110 may determine the device under test 200 to be a first grade, e.g. grade A, when the first testing results in a pass judgment, and may determine the device under test 200 to be a second grade, e.g. grade B, when the second testing result indicates a pass judgment. The test apparatus 10 may test a plurality of devices under test 200 formed on one wafer, and display a grade or a pass/fail judgment of each device under test 200 in association with a position of the device under test 200 on the wafer.

Figure 7:
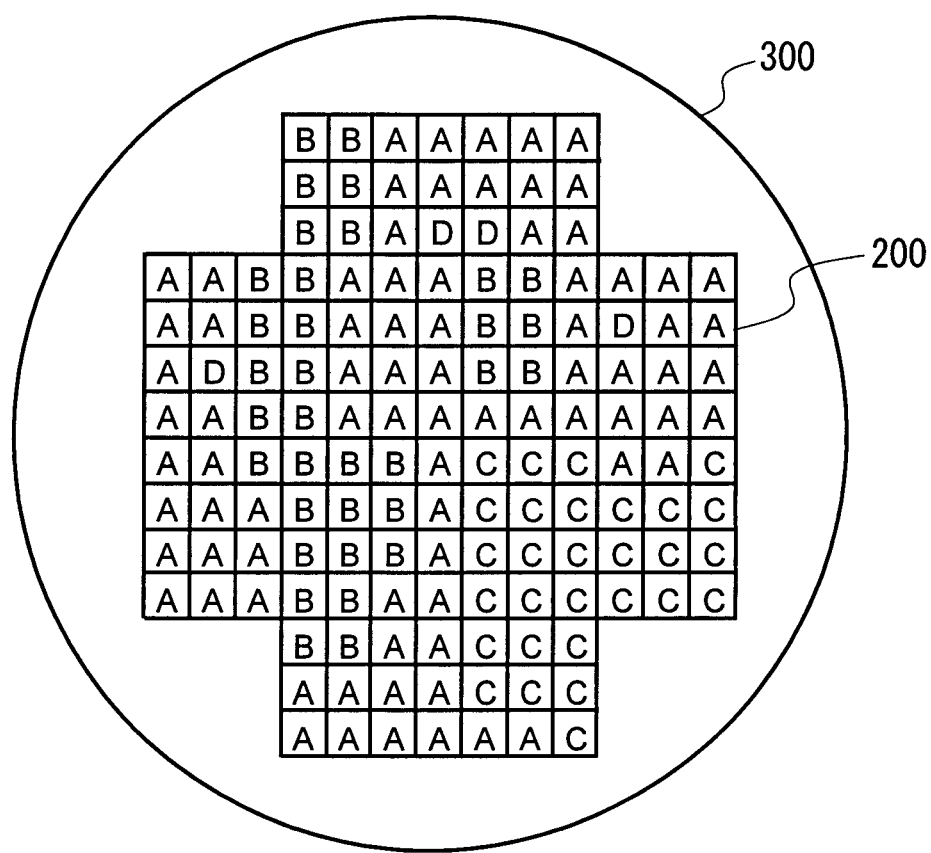
FIG. 7 shows an exemplary display of grade determination results of devices under test 200.

FIG. 7 shows an exemplary display of grade determination results of devices under test 200. The display section 106 may display squares to represent the devices under test 200 in a circle representing a wafer 300. Each letter A, B, C, and D in FIG. 7 represents the grade of the corresponding device under test 200.

In FIG. 7, the test apparatus 10 displays grades from A to D at each position of a device under test 200 on the wafer. Grade A corresponds to a command path 3 for a testing condition of a prescribed timing and voltage level of the test signal. Grades B, C, and D correspond respectively to command paths 2, 1, and 0 for testing conditions of a prescribed timing and voltage level of the test signal.

FIG. 8 shows an exemplary Shmoo plot of a device under test 200 determined to be grade A. The test apparatus 10 may determine the grade of the device under test 200 based on which command path is most prevalent in a prescribed region of the Shmoo plot. For example, in FIG. 8, the command path 3 is the most prevalent in the coordinate region near the intermediate value of the timings and voltage levels, as shown by the thick-lined box, and therefore the test apparatus 10 may determine the device under test 200 to be grade A.

Figure 9:
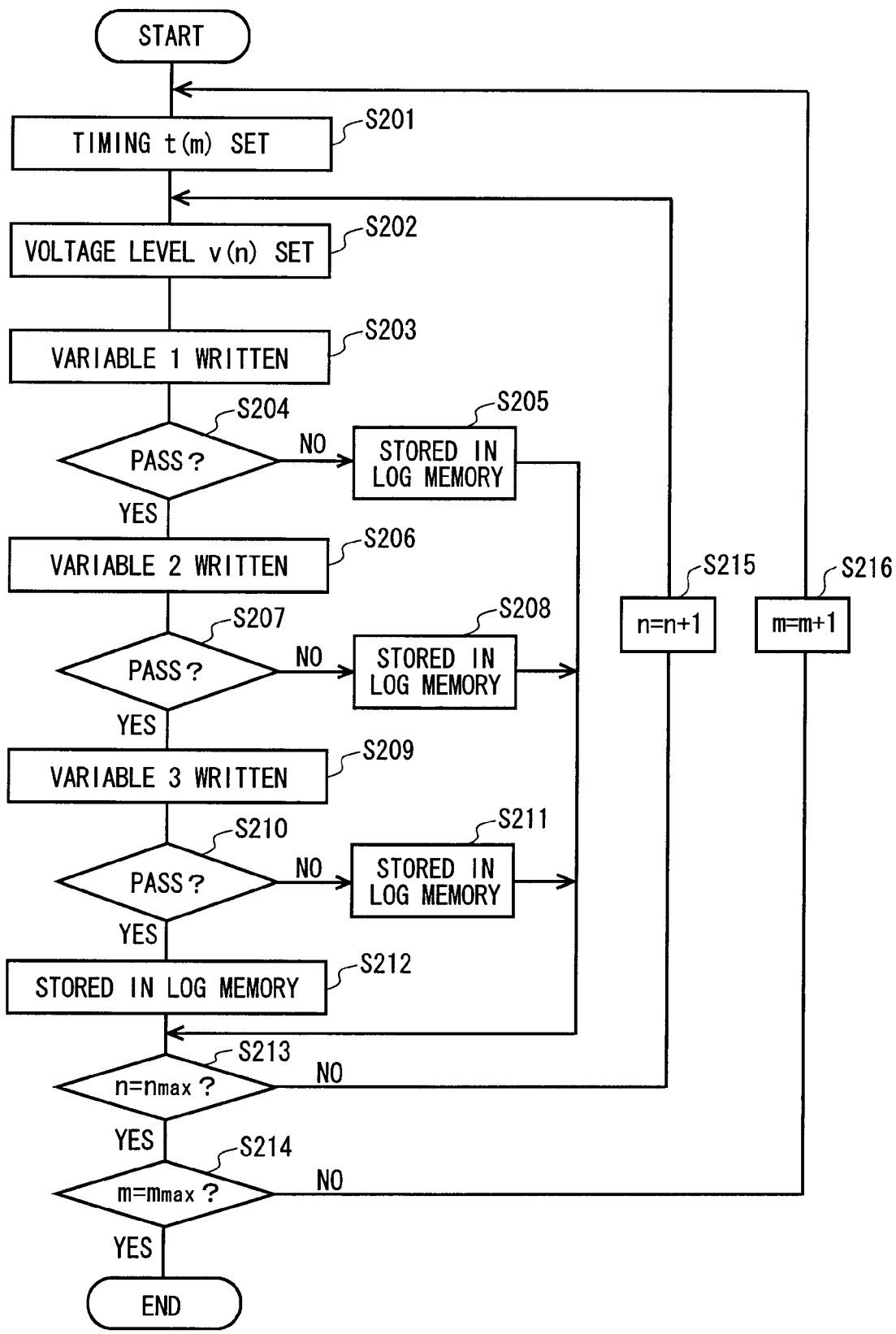
FIG. 9 shows an exemplary operational flow of a test apparatus 10 according to another embodiment of the present invention.

FIG. 9 shows an operational flow of a test apparatus 10 according to another embodiment of the present invention. In FIG. 9, the test apparatus 10 transmits write packets for writing different variables to a register of the device under test 200, each time a test packet is transmitted (S203, S206, S209). This register may store values to be set for the sampling timing phase value or threshold voltage value of a comparator in the device under test 200, for example. The test apparatus 10 can display the optimal variable values corresponding to the test conditions in a Shmoo plot, by storing timings and voltage levels of the test signal in the log memory 108 in association with the command paths for writing different variables.

This register may indicate information relating to data error, such as a threshold value for the bit error rate measured in the device under test 200 or the number of times that a packet is retransmitted between the testing section 100 and the device under test 200. The test apparatus 10 can display the data error rate corresponding to each testing condition in a Shmoo plot, by storing the timings and voltage levels of the test signal in the log memory 108 in association with the command paths for writing different variables.

For each testing condition, the test apparatus 10 may display the region corresponding to each combination of the command path and the variable value differently in the Shmoo plot. The test apparatus 10 may determine the grade of the device under test 200 according to the combinations of the command paths and the variable values.

Figure 10:
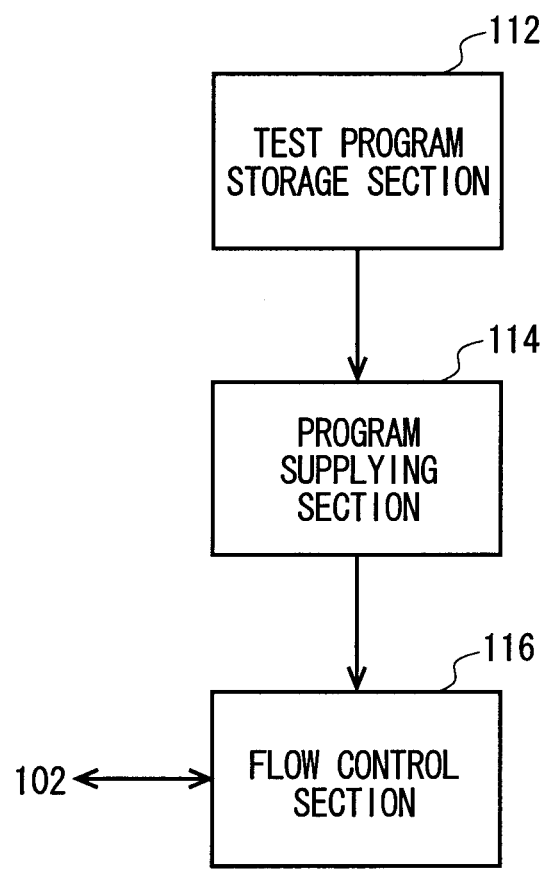
FIG. 10 shows an exemplary configuration of the execution processing section 11.

FIG. 10 shows an exemplary configuration of the execution processing section 11. The execution processing section 11 includes a test program storage section 112, a program supplying section 114, and a flow control section 116.

The test program storage section 112 stores the test programs. The test program storage section 112 may acquire the test programs from the main memory 104. The program supplying section 114 extracts a plurality of packet lists from a test program stored in the test program storage section 112, and stores the packet lists in packet list storage sections 20 in the pattern generating section 12 and the measuring section 14. The program supplying section 114 generates a control program, in which is recorded a control flow for sequentially executing the packet lists extracted from the test program, and supplies the control program to the flow control section 116.

The flow control section 116 designates, for the pattern generating section 12 and the measuring section 14, the order in which the packet lists are to be executed, according to the execution flow of the test program. More specifically, the flow control section 116 executes the control program received from the program supplying section 114, to identify for the pattern generating section 12 and the measuring section 14 the next packet list to be executed. For example, the flow control section 116 may transmit to the pattern generating section 12 and the measuring section 14 an address of the packet list to be executed next.

If the control program includes computations such as conditional branching, unconditional branching, or subroutine acquisition, the flow control section 116 may cause the main control section 102 to execute the control program. The flow control section 116 may identify the packet list to be executed next based on the computation results of the computation by the main control section 102. In this case, the flow control section 116 may wait to identify the next packet list until receiving the computation result from the main control section 102, and select the packet list to identify according to the computation result.

Figure 11:
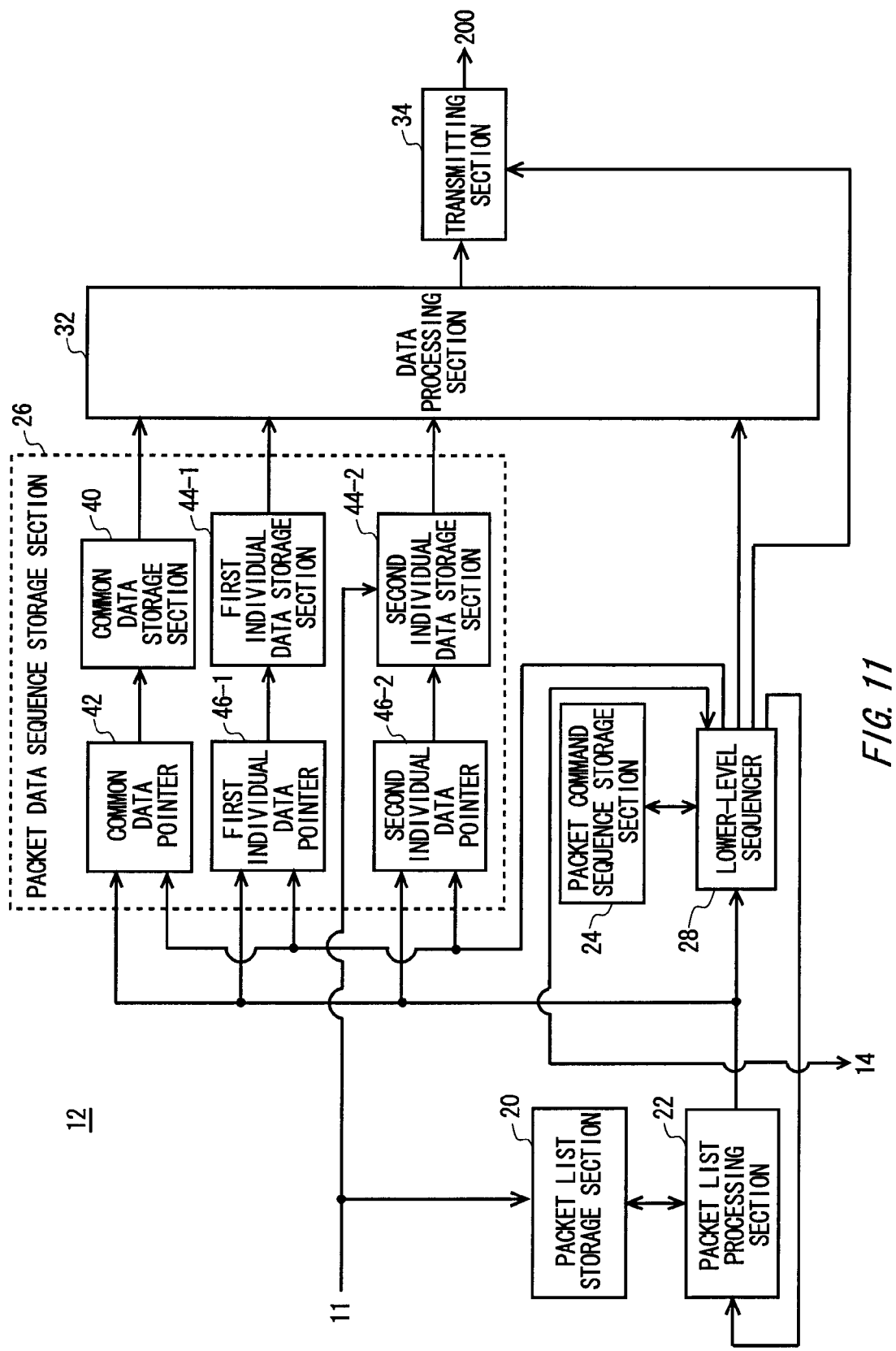
FIG. 11 shows an exemplary configuration of the pattern generating section 12.

FIG. 11 shows an exemplary configuration of the pattern generating section 12. The pattern generating section 12 includes a packet list storage section 20, a packet list processing section 22, a packet command sequence storage section 24, a packet data sequence storage section 26, a lower-level sequencer 28, a data processing section 32, and a transmitting section 34.

The packet list storage section 20 stores a plurality of packet lists supplied from the program supplying section 114. The packet list processing section 22 executes a packet list based on the address designated by the flow control section 116, from among the packet lists stored in the packet list storage section 20, to sequentially designate the packets to be transmitted to the device under test 200.

The packet list processing section 22 may designate an address, e.g. a leading address, in the packet command sequence storage section 24 of a command sequence for generating the designated packet, fore example, for each packet to be transmitted to the device under test 200. Furthermore, the packet list processing section 22 may designate an address, e.g. a leading address, of a data sequence included in the packet in the packet data sequence storage section 26 to be transmitted to the device under test 200.

In this way, the packet list processing section 22 individually designates an address of a command sequence for generating a packet and an addresses of a data sequence included in the packet. In this case, if a command sequence or data sequence is designated that is common to two or more packets in the packet list, the packet list processing section 22 may designate the same command sequence address or the same data sequence address for the two or more packets.

The packet command sequence storage section 24 stores, for each type of packet, a command sequence for generating a corresponding type of packets. For example, the packet command sequence storage section 24 may store a command sequence for generating write packets, a command sequence for generating read packets, and a command sequence for generating wait packets.

The packet data sequence storage section 26 stores, for each type of packet, a data sequence included in a corresponding type of packet. For example, the packet data sequence storage section 26 may store a data sequence included in a write packet, a data sequence included in a read packet, and a data sequence included in a wait packet.

The packet data sequence storage section 26 may include a common data storage section 40, a common data pointer 42, a first individual data storage section 44-1, a second individual data storage section 44-2, a first individual data pointer 46-1, and a second individual data pointer 46-2. The common data storage section 40 stores common data that is shared among the packet types, in a data sequence included in each type of packet. The common data storage section 40 may store, for each packet type, a start code indicating the start of the packet, an end code indicating the end of the packet, and a command code for identifying the type of the packet.

The common data pointer 42 acquires, from the packet list processing section 22, a leading address of a block in which is stored the common data included in the packet designated by the packet list processing section 22. Furthermore, the common data pointer 42 acquires from the lower-level sequencer 28 an offset position within the block. The common data pointer 42 provides the common data storage section 40 with the address determined based on the leading address and the offset position, e.g. an address that is the sum of the leading address and the offset position, and supplies the data processing section 32 with the common data stored at this address.

The first and second individual data storage sections 44-1 and 44-2 store individual data that changes for each packet, in the data sequence included in each packet type. The first and second individual data storage sections 44-1 and 44-2 may store actual data transmitted to the device under test 200 or actual data received from the device under test 200, which is included in each packet.

The first individual data storage section 44-1 stores predetermined individual data that is not affected by the test program being executed. The second individual data storage section 44-2 stores individual data that is changed for each test program executed. For example, the second individual data storage section 44-2 receives individual data from the main memory 104, either before testing or during testing as desired.

The first and second individual data pointers 46-1 and 46-2 receive from the packet list processing section 22 the leading address of the block in which is stored the individual data included in the packet designated by the packet list processing section 22. Furthermore, the first and second individual data pointers 46-1 and 46-2 acquire from the lower-level sequencer 28 the offset position in this block. The first and second individual data pointers 46-1 and 46-2 supply the first and second individual data storage sections 44-1 and 44-2 with the address determined based on the leading address and the offset position, e.g. an address that is the sum of the leading address and the offset position, and supply the data processing section 32 with the individual data stored at this address.

The lower-level sequencer 28 reads from the packet command sequence storage section 24 the command sequence of the packet designated by the packet list processing section 22, i.e. the command sequence at the address designated by the packet list processing section 22, and sequentially executes the commands included in the read command sequence. Furthermore, the lower-level sequencer 28 sequentially reads from the packet data sequence storage section 26, according to the command sequence execution, the data sequence of the packet designated by the packet list processing section 22, i.e. the data sequence at the address designated by the packet list processing section 22, and generates the test data pattern used for testing the device under test 200.

The lower-level sequencer 28 may supply the common data pointer 42, the individual data pointer 46-1, and the individual data pointer 46-2 with the offset position indicating the position of the data corresponding to the executed command in the block storing the data sequence included in the packet designated by the packet list processing section 22, for example. In this case, the lower-level sequencer 28 may generate an expected value at the first command and generate the offset position to be a count value that is incremented each time the command being executed changes. The command sequences executed by the lower-level sequencer 28 preferably do not include jump-forward commands or branching commands. As a result, the lower-level sequencer 28 can achieve high-speed processing with a simple configuration.

For each command execution, the lower-level sequencer 28 supplies the data processing section 32 with control data instructing application of a designated process, e.g. a computation or data conversion, to the read individual data or the common data. As a result, the lower-level sequencer 28 can cause a designated data portion in the packet designated by the packet list processing section 22 to be data resulting from a designated process being applied to the read data.

For each command execution, the lower-level sequencer 28 designates which of the common data, the individual data, and the data processed by the data processing section 32 is output by the data processing section 32. Here, the individual data is the predetermined individual data that is not affected by the test program being executed or the individual data that changes for each packet being executed. In other words, for each command execution, the lower-level sequencer 28 designates, for the data processing section 32, that data is to be read and output from one of the common data storage section 40, the first individual data storage section 44-1, the second individual data storage section 44-2, and the register storing the processed data in the data processing section 32.

As a result, the lower-level sequencer 28 can generate the data portion that changes for each packet in the packet designated by the packet list processing section 22, based on the individual data read from the individual data storage section 44. Furthermore, the lower-level sequencer 28 can generate the data portion common to each packet type in the packet designated by the packet list processing section 22, based on the common data read from the common data storage section 40. Yet further, the lower-level sequencer 28 can cause the designated data portion in the packet designated by the packet list processing section 22 to be data resulting from the designated process being applied to the read data.

The transmission-side lower-level sequencer 28 may notify the reception-side lower-level sequencer 28 that a test data sequence of the predesignated packet has been transmitted to the device under test 200, for example. In this way, the transmission-side lower-level sequencer 28 can prevent the judging section 84 from making the pass/fail judgment of the data received by the receiving section 82 until the reception-side lower-level sequencer 28 receives notification from the transmission-side lower-level sequencer 28.

The transmission-side lower-level sequencer 28 may receive notification from the reception-side lower-level sequencer 28 that a data sequence matching the generated test data sequence has been received, and generate the test sequence data of the predesignated packet, for example. In this way, the transmission-side lower-level sequencer 28 can transmit the predesignated packet to the device under test 200 after the prescribed packet is received from the device under test 200.

The data processing section 32 may receive data from the common data storage section 40, the first individual data storage section 44-1, and the second individual data storage section 44-2, perform the process designated by the lower-level sequencer 28 on the received data, and output the result as the data of the test data sequence. Depending on the content of the designation by the lower-level sequencer 28, the data processing section 32 may output the received data as-is, as the test data sequence. The transmitting section 34 transmits the test data sequence output by the data processing section 32 to the device under test 200.

Figure 12:
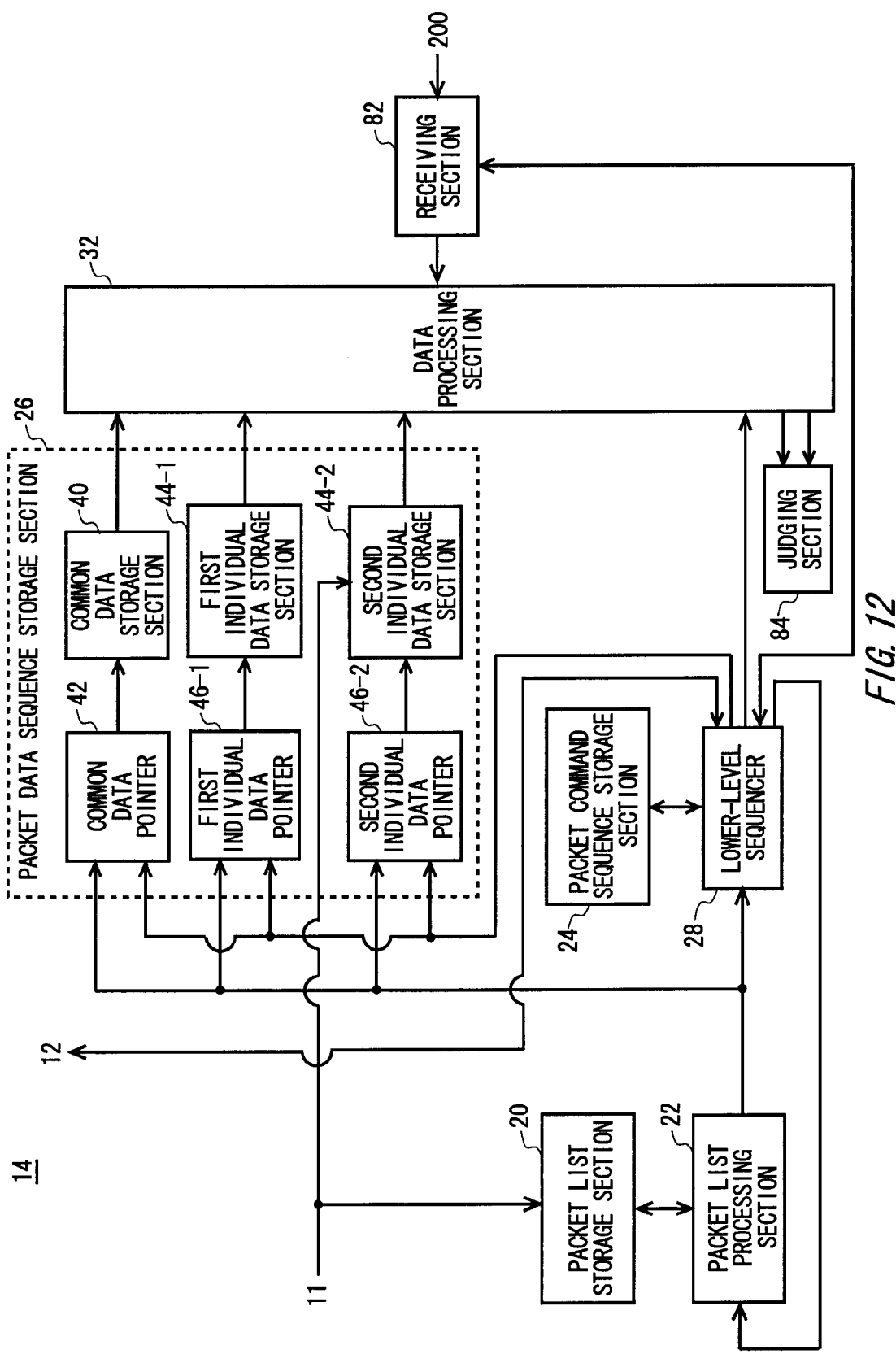
FIG. 12 shows an exemplary configuration of the measuring section 14.

FIG. 12 shows an exemplary configuration of the measuring section 14. The measuring section 14 has substantially the same function and configuration as the pattern generating section 12 shown in FIG. 11. Components of the measuring section 14 that have the same function and configuration as components of the pattern generating section 12 are given the same reference numerals, and further description is omitted.

The measuring section 14 includes a packet list storage section 20, a packet list processing section 22, a packet command sequence storage section 24, a packet data sequence storage section 26, a lower-level sequencer 28, a data processing section 32, a receiving section 82, and a judging section 84. The receiving section 82 receives the data sequences of reception packets from the device under test 200. The data processing section 32 in the measuring section 14 receives the data sequence received by the receiving section 82, and outputs the received data sequence together with the generated test data sequence.

The lower-level sequencer 28 in the measuring section 14 outputs the data sequence of the packet expected to be output from the device under test 200, as the test data sequence. The lower-level sequencer 28 in the measuring section 14 designates, for the receiving section 82, a strobe timing for acquiring the data value of the signal output from the device under test 200.

The judging section 84 receives, from the data processing section 32, the test data sequence and the data sequence received by the receiving section 82. The judging section 84 judges pass/fail of the communication with the device under test 200, based on the result of a comparison between the data sequence received by the receiving section 82 and the test data sequence. For example, the judging section 84 may include a logic comparing section that makes a comparison to determine whether the test data sequence and the data sequence received by the receiving section 82 match, and a fail memory that records the comparison results.

The lower-level sequencer 28 in the measuring section 14 communicates with the transmission-side lower-level sequencer 28 of the pattern generating section 12 shown in FIG. 11. As a result, the reception-side lower-level sequencer 28 of the measuring section 14 can execute command sequences in synchronization with the transmission-side lower-level sequencer 28 of the pattern generating section 12 by performing a handshake with the transmission-side lower-level sequencer 28.

The reception-side lower-level sequencer 28 may notify the transmission-side lower-level sequencer 28 when a data sequence is received that matches the test data sequence generated by the reception-side lower-level sequencer 28. As a result, the transmission-side lower-level sequencer 28 can receive the notification from the reception-side lower-level sequencer 28 that a data sequence matching the generated test data sequence is received, and generate the test data pattern of the predesignated packet.

The reception-side lower-level sequencer 28 may prohibit the judging section 84 from performing the pass/fail judgment of the data sequence received by the receiving section 82 until notification is received from the transmission-side lower-level sequencer 28 that the test data sequence of the predesignated packet has been transmitted to the device under test 200. As a result, the reception-side lower-level sequencer 28 can judge whether the device under test 200 has output a response to the prescribed packet after the prescribed packet has been transmitted to the device under test 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a testing section operable to store a program and test the device under test by executing the program, the program including a plurality of commands at least one of which branches according to a branching condition, the testing section further operable to detect the branching condition and execute the program according to the detected branching condition such that the execution of the program includes executing one or more of the plurality of commands; and
    a log memory that stores test results of the testing section in association with command paths indicating the one or more of the plurality of commands executed when the program was executed to obtain the test results.

2. The test apparatus according to claim 1, wherein
    the testing section sequentially changes a characteristic of a test signal supplied to the device under test, and judges pass/fail of the device under test for each characteristic of the test signal, and
    the log memory stores a test result of the testing section in association with a command path of the program, for each characteristic of the test signal.

3. The test apparatus according to claim 2, further comprising a display section that displays the test result for each characteristic of the test signal stored in the log memory, using a different appearance for each command path of the program.

4. The test apparatus according to claim 3, wherein
    the testing section sequentially changes one or more characteristics of the test signal supplied to the device under test, and judges pass/fail of the device under test for each change in the one or more characteristics of the test signal, and
    the display section plots each test result corresponding to a change of the one or more characteristics of the test signal using a different appearance for each command path of the program, in a coordinate system whose axes each represent one of the one or more characteristics of the test signal.

5. The test apparatus according to claim 2, wherein
    the program stored in the testing section is a procedure in which is recorded packet sequence information designating the order in which packets are sent to and received from the device under test, and
    the testing section includes a pattern generating section that assembles packets designated by a packet list recorded in the procedure into a prescribed format and transmits the packets to the device under test.

6. The test apparatus according to claim 3, wherein
    the testing section judges pass/fail for each of a plurality of locations in the device under test, and
    the display section displays the test results using a different appearance for each location in the device under test for which the pass/fail judgment is made.

7. The test apparatus according to claim 1, wherein the testing section includes:
    a measuring section that measures a state of the device under test; and
    an execution processing section that executes the program, using a measurement result of the measuring section as the branching condition.

8. The test apparatus according to claim 1, further comprising a grade determining section that judges a grade of the device under test based on a command path of the program corresponding to each test result of the testing section.

9. The test apparatus according to claim 8, wherein
    the test apparatus tests a plurality of the devices under test formed on one wafer, and displays the grade or pass/fail of each device under test in association with a position of the device under test on the wafer.

10. The test apparatus according to claim 1, wherein the testing section includes a pattern generating section that assembles packets into a prescribed format and transmits the packets to the device under test.

11. A test method for testing a device under test using a test apparatus including a processor and a memory, comprising:
   testing the device under test by executing a program using the processor, the program including a plurality of commands at least one of which branches according to a branching condition, the testing including detecting the branching condition and executing the program according to the detected branching condition such that the execution of the program includes executing one or more of the plurality of commands; and
   storing, in the memory, test results in association with command paths indicating the one or more of the plurality of commands executed when the program was executed to obtain the test results.

12. The test method according to claim 11, wherein
   the testing includes sequentially changing a characteristic of a test signal supplied to the device under test, and judging pass/fail of the device under test for each characteristic of the test signal, and
   the storing includes storing a test result in association with a command path of the program, for each characteristic of the test signal.

13. The test method according to claim 12, further comprising displaying the stored test result for each characteristic of the test signal, using a different appearance for each command path of the program.

14. The test method according to claim 13, wherein
   the testing includes sequentially changing one or more characteristics of the test signal supplied to the device under test, and judging pass/fail of the device under test for each change in the one or more characteristics of the test signal, and
   the displaying includes plotting each test result corresponding to a change of the one or more characteristics of the test signal using a different appearance for each command path of the program, in a coordinate system whose axes each represent one of the one or more characteristics of the test signal.

15. The test method according to claim 12, wherein
   the program is a procedure in which is recorded packet sequence information designating the order in which packets are sent to and received from the device under test, and
   the testing includes assembling packets designated by a packet list recorded in the procedure into a prescribed format and transmitting the packets to the device under test.

16. The test method according to claim 13, wherein
   the testing includes judging pass/fail for each of a plurality of locations in the device under test, and
   the displaying includes displaying the test results using a different appearance for each location in the device under test for which the pass/fail judgment is made.

17. The test method according to claim 11, wherein the testing includes:
   measuring a state of the device under test to obtain a measurement result; and
   executing the program using the measurement result as the branching condition.

18. The test method according to claim 11, further comprising judging a grade of the device under test based on a command path of the program corresponding to each test result.

19. The test method according to claim 18, wherein
   a plurality of the devices under test formed on one wafer, and the grade or pass/fail of each device under test is displayed in association with a position of the device under test on the wafer.

20. The test method according to claim 11, wherein the testing includes assembling packets into a prescribed format and transmitting the packets to the device under test.

* * * * *